(12) United States Patent
Hammill et al.

(10) Patent No.: US 12,405,038 B2
(45) Date of Patent: Sep. 2, 2025

(54) THERMOELECTRIC ASSEMBLIES WITH PLASTIC MOISTURE BARRIERS

(71) Applicant: Laird Thermal Systems, Inc., Morrisville, NC (US)

(72) Inventors: Matthew Hammill, Haddon Township, NJ (US); Xiang Liu, Shenzhen (CN)

(73) Assignee: Tark Thermal Solutions, Inc., Morrisville, NC (US)

( * ) Notice: Subject to any disclaimer, the term of this patent is extended or adjusted under 35 U.S.C. 154(b) by 359 days.

(21) Appl. No.: 17/967,519

(22) Filed: Oct. 17, 2022

(65) Prior Publication Data

US 2023/0272948 A1 Aug. 31, 2023

Related U.S. Application Data

(60) Provisional application No. 63/314,040, filed on Feb. 25, 2022.

(51) Int. Cl.
| | | |
|---|---|---|
| *F25B 21/02* | (2006.01) | |
| *H10N 10/17* | (2023.01) | |
| *H10N 10/80* | (2023.01) | |

(52) U.S. Cl.
CPC ............ *F25B 21/02* (2013.01); *H10N 10/17* (2023.02); *H10N 10/80* (2023.02); *F25B 2321/023* (2013.01); *F25B 2321/0251* (2013.01)

(58) Field of Classification Search
CPC ................ F25B 21/02; F25B 2321/023; F25B 2321/0251; H10N 10/17; H10N 10/80
See application file for complete search history.

(56) References Cited

U.S. PATENT DOCUMENTS

| 5,501,076 A | 3/1996 | Sharp, III et al. |
| 5,841,064 A | 11/1998 | Maekawa et al. |

(Continued)

FOREIGN PATENT DOCUMENTS

| JP | 6448980 B2 | 1/2019 | |
| WO | WO-2018159291 A1 * | 9/2018 | ............. H10N 10/01 |
| WO | WO-2021124767 A1 | 6/2021 | |

OTHER PUBLICATIONS

Kato et al., Thermoelectric Conversion Module and Method for Producing Same, Sep. 7, 2018, Sep. 7, 2018, Whole Document (Year: 2018).*

(Continued)

*Primary Examiner* — Elizabeth J Martin
*Assistant Examiner* — Adam Dorrel Moore
(74) *Attorney, Agent, or Firm* — Harness, Dickey & Pierce, P.L.C.; Anthony G. Fussner

(57) ABSTRACT

A thermoelectric assembly includes a thermoelectric module having a hot side and a cold side, a first heat exchanger coupled to the hot side of the thermoelectric module, a second heat exchanger coupled to the cold side of the thermoelectric module, a gasket positioned between the first heat exchanger and the second heat exchanger and defining an opening for receiving the thermoelectric module, and a plastic barrier film. The gasket includes an inner perimeter adjacent to the thermoelectric module and an outer perimeter distal to the thermoelectric module. The plastic barrier film is coupled to at least a portion of the outer perimeter of the gasket to substantially inhibit an ingress of moisture to the gasket and the thermoelectric module. Other example thermoelectric assemblies are also disclosed.

20 Claims, 5 Drawing Sheets

(56) References Cited

U.S. PATENT DOCUMENTS

| | | | |
|---|---|---|---|
| 6,073,449 A * | 6/2000 | Watanabe et al. | H10N 10/17 62/3.2 |
| 6,345,507 B1 | 2/2002 | Gillen | |
| 6,530,231 B1 | 3/2003 | Nagy et al. | |
| 6,662,571 B1 | 12/2003 | Nagy et al. | |
| 7,032,389 B2 | 4/2006 | Cauchy | |
| 7,851,691 B2 | 12/2010 | DeSteese et al. | |
| 7,997,795 B2 | 8/2011 | Schwagerman et al. | |
| 8,455,751 B2 | 6/2013 | Olsen et al. | |
| 9,360,240 B2 | 6/2016 | Höjer et al. | |
| 9,741,917 B2 | 8/2017 | Lee et al. | |
| 9,786,830 B2 | 10/2017 | Hayashi et al. | |
| 9,796,156 B2 | 10/2017 | Kenmochi et al. | |
| 10,808,971 B2 | 10/2020 | Nagy et al. | |
| 2006/0000500 A1 * | 1/2006 | Sauciuc et al. | H01L 23/38 136/212 |
| 2018/0170022 A1 * | 6/2018 | Kawada et al. | B32B 27/08 |
| 2020/0020898 A1 | 1/2020 | Yi et al. | |
| 2021/0003324 A1 | 1/2021 | Nagy et al. | |
| 2021/0010723 A1 * | 1/2021 | Nagy et al. | F25B 47/006 |
| 2021/0036202 A1 | 2/2021 | Hara et al. | |
| 2021/0036203 A1 | 2/2021 | Morita et al. | |

OTHER PUBLICATIONS

Extended European search report dated Jun. 29, 2023 for EP22204492.7 that claims priority to the instant application; 7 pages.

* cited by examiner

THERMOELECTRIC ASSEMBLIES WITH PLASTIC MOISTURE BARRIERS

CROSS-REFERENCE TO RELATED APPLICATION

This application claims the benefit of and priority to U.S. Provisional Application Ser. No. 63/314,040 filed Feb. 25, 2022. The entire disclosure of this provisional patent application is incorporated herein by reference.

FIELD

The present disclosure relates to thermoelectric assemblies with plastic moisture barriers.

BACKGROUND

This section provides background information related to the present disclosure which is not necessarily prior art.

Thermoelectric assemblies are commonly employed to control temperatures in various applications. A thermoelectric assembly typically includes one or more thermoelectric devices and heat exchangers to transfer heat from one side of the assembly to the other side of the assembly. In some examples, the thermoelectric assembly may include a vapor barrier formed of a metallic material (e.g., aluminum, metalized plastic, etc.), a ceramic material, or a glass material to prevent water vapor from penetrating into the assembly.

SUMMARY

This section provides a general summary of the disclosure and is not a comprehensive disclosure of its full scope or all of its features.

According to one aspect of the present disclosure, a thermoelectric assembly includes a thermoelectric module including a hot side and a cold side, a first heat exchanger coupled to the hot side of the thermoelectric module, a second heat exchanger coupled to the cold side of the thermoelectric module, a gasket positioned between the first heat exchanger and the second heat exchanger and defining an opening for receiving the thermoelectric module, and a plastic barrier film. The gasket includes an inner perimeter adjacent to the thermoelectric module and an outer perimeter distal to the thermoelectric module. The plastic barrier film is coupled to at least a portion of the outer perimeter of the gasket to substantially inhibit an ingress of moisture to the gasket and the thermoelectric module.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Thermoelectric assemblies are used to control temperature in various applications. In some cases, moisture may be present in environments around the thermoelectric assemblies. For example, humidity in the air around a thermoelectric assembly increases as the air temperature approaches a dew point, and water vapor (liquid) may form if the air temperature falls below the dew point. Such moisture (e.g., humidity, water vapor, etc.) may degrade thermoelectric modules and/or other components in the assemblies. For example, moisture may reduce the performance of the thermoelectric modules and/or other components in the assemblies, cause corrosion within the thermoelectric modules, etc.

As explained herein, barrier films may be positioned on portions of the thermoelectric assemblies to substantially inhibit an ingress of moisture into the thermoelectric assemblies. The barrier films disclosed herein include only one or more plastic materials. For example, the barrier films do not include metal, metalized plastic, ceramic, or glass. Also, for example, the barrier films disclosed herein may be formed of a thermoplastic material such as a polyimide material, a polypropylene material, etc. In some examples, the barrier films may include, for example, Kapton® FN, Tyvek®, etc. Additionally, in some examples, the barrier films may be coated with fluorinated ethylene propylene (FEP) or other coating for better moisture protection.

The barrier films disclosed herein may have any suitable thickness. For example, any one of the barrier films may have a thickness ranging between 0.01 mm and 1.2 mm, less than 0.01 mm, more than 1.2 mm, etc. For instance, the thickness of the barrier film may be 0.01 mm, 0.025 mm, 0.050 mm, 0.075 mm, 0.1 mm, 1.0 mm, 1.2 mm, etc. Further, adhesive may be employed to couple the barrier film to portions of a thermoelectric assembly (TEA) as further explained below. In such embodiments, the adhesive may have a thickness of roughly 0.5 mm, more or less than 0.5 mm, etc.

Figure 1:
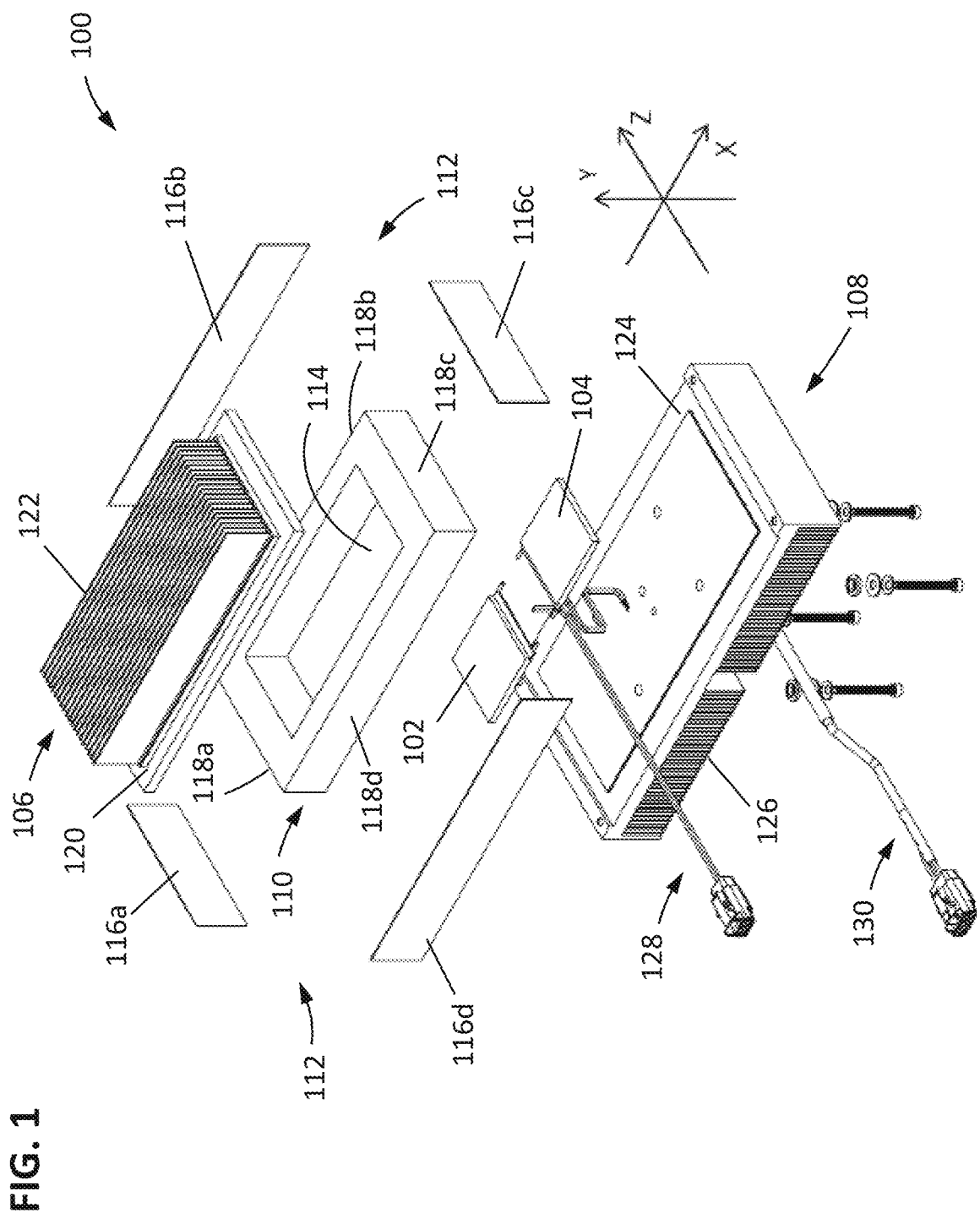
FIG. 1 is an exploded isometric view of a thermoelectric assembly including a plastic barrier film according to one example embodiment of the present disclosure.
Figure 2:
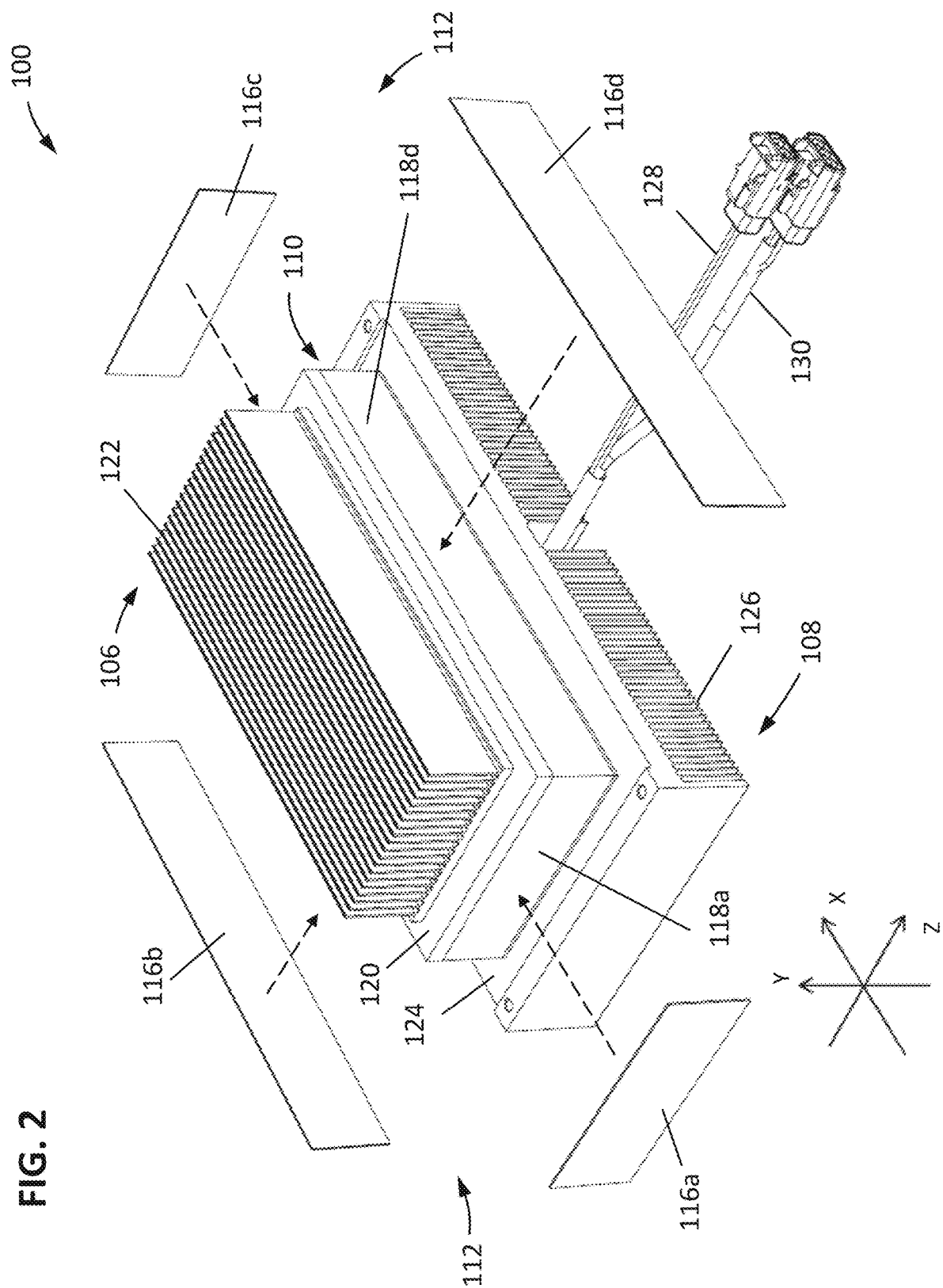
FIG. 2 is a partially exploded isometric view of the thermoelectric assembly of FIG. 1.

For example, a thermoelectric assembly (TEA) according to one example embodiment of the present disclosure is illustrated in FIGS. 1-2 and indicated generally by the reference number 100. As shown, the TEA 100 includes first and second thermoelectric modules (TEMs) 102, 104 each including a cold side and a hot side. The TEA 100 further includes a first heat exchanger 106, a second heat exchanger 108, a gasket 110, and a plastic barrier film 112. The second heat exchanger 108 is coupled to the cold sides of the TEMs 102, 104, and the first second heat exchanger 106 is coupled to the hot sides of the TEMs 102, 104. As shown, the gasket 110 is positioned between the heat exchangers 106, 108, and defines an opening 114 for receiving the TEMs 102, 104. The gasket 110 includes an inner perimeter adjacent to the TEMs 102, 104, and an outer perimeter distal to the TEMs 102, 104.

In the example of FIGS. 1-2, the plastic barrier film 112 includes four segments 116a, 116b, 116c, 116d coupled to the outer perimeter of the gasket 110. For example, in the embodiment of FIGS. 1-2, the outer perimeter of the gasket 110 is defined by four perimeter surfaces 118a, 118b, 118c, 118d. In such examples, the segments 116a, 116b, 116c, 116d of the plastic barrier film 112 are coupled to the perimeter surfaces 118a, 118b, 118c, 118d, respectively, of the gasket 110.

The plastic barrier film 112 substantially inhibits an ingress of moisture to the gasket 110 and the TEMs 102, 104. In some examples, the ingress of moisture may be substantially prevented due to the size and/or shape of the plastic barrier film 112, properties of the plastic barrier film 112, etc.

For example, each segment 116a, 116b, 116c, 116d of the plastic barrier film 112 may have a size (e.g., in the X and Y directions) and shape (e.g., rectangular) substantially similar to its corresponding perimeter surface 118a, 118b, 118c, 118d of the gasket 110. This ensures coverage about the outer perimeter of the gasket 110 to reduce exposed portions of the gasket 110 that may otherwise absorb moisture. In some examples, the segments 116a, 116b, 116c, 116d may be sized and shaped to cover the entire outer perimeter of the gasket 110.

In various embodiments, the plastic barrier film 112 may substantially cover the outer perimeter of the gasket 110 and portions of the heat exchangers 106, 108. For example, each segment 116a, 116b, 116c, 116d of the plastic barrier film 112 may be sized (e.g., in the X and Y directions) to cover its corresponding perimeter surfaces 118a, 118b, 118c, 118d of the gasket 110 and a side surface of the heat exchanger 106 (e.g., a base 120 of the heat exchanger 106). In some cases, the segment 116a, 116b, 116c, 116d may be substantially flush with a top surface (e.g., a top edge) of the base 120 of the heat exchanger 106. In such examples, the plastic barrier film 112 may extend between a top surface of a base 124 of the heat exchanger 108 and the top surface (e.g., the top edge) of the base 120 of the heat exchanger 106.

In other examples, the plastic barrier film 112 may cover portions of the outer perimeter of the gasket 110. For example, one or more gaps may exist between adjacent pairs of the segments 116a, 116b, 116c, 116d, and/or between one of the segments 116a, 116b, 116c, 116d and one of the heat exchangers 106, 108. In such examples, a sealant material such as a water inhibiting material may be employed to cover the gaps between the segments 116a, 116b, 116c, 116d and/or heat exchangers 106, 108.

Additionally, in some examples, the plastic barrier film 112 may have desirable properties such as a water vapor permeability and/or a moisture absorption rate to inhibit an ingress of moisture through the film. For example, the plastic barrier film 112 may be formed of a material having a water vapor permeability between 1 and 20 $g/m^2*24$ hr (according to the ASTM E96 test method) and a moisture absorption rate between 0.2 and 1.5% at 23° C. and 50% RH (according to the ASTM D570 test method).

In the embodiment of FIGS. 1-2, the plastic barrier film 112 is adhesively coupled to the outer perimeter of the gasket 110. For example, the plastic barrier film 112 may be a tape having an adhesive coating along one of its surfaces. For instance, each segment 116a, 116b, 116c, 116d may have an adhesive coating along a surface that contacts its corresponding perimeter surface 118a, 118b, 118c, 118d of the gasket 110.

Figure 5:
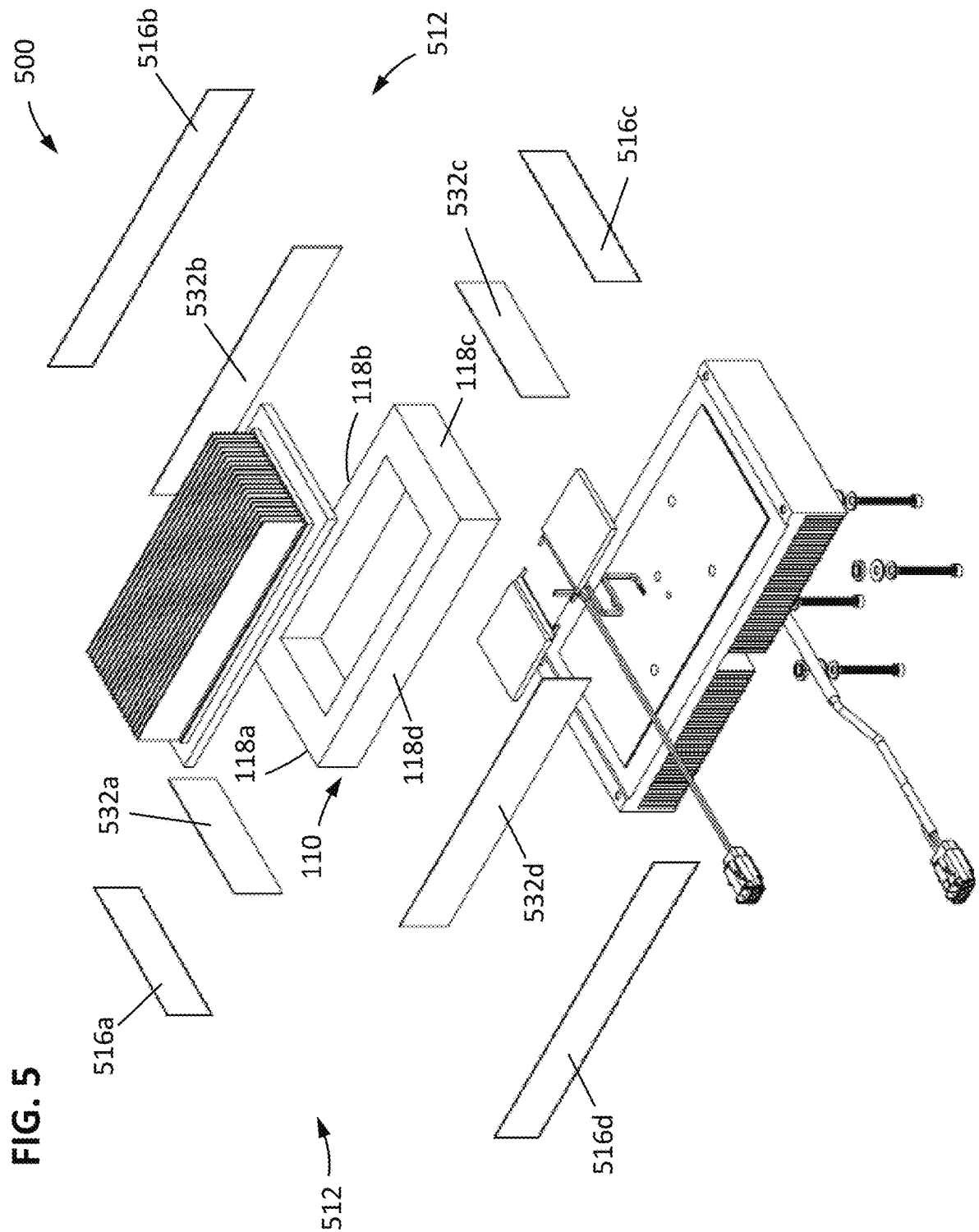
FIG. 5 is an exploded isometric view of a thermoelectric assembly including a gasket and a plastic barrier film including segments coupled to the gasket via adhesive layers according to another example embodiment.

In other examples, the plastic barrier film 112 may be adhesively coupled to the outer perimeter of the gasket 110 via a separate, intervening adhesive layer. For example, FIG. 5 illustrates a TEA 500 substantially similar to the TEA 100 of FIGS. 1-2 but including adhesive layers between the plastic barrier film and the gasket. Specifically, the TEA 500 of FIG. 5 includes the gasket 110 of FIGS. 1-2 and a plastic barrier film 512 adhesively coupled to the outer perimeter of the gasket 110. More specifically, the plastic barrier film 512 includes segments 516a, 516b, 516c, 516d coupled to the perimeter surfaces 118a, 118b, 118c, 118d of the gasket 110 via adhesive layers 532a, 532b, 532c, 532d, respectively. In such examples, the adhesive layers 532a, 532b, 532c, 532d may include double sided tape or the like.

Referring back to the embodiment of FIGS. 1-2, the TEA 100 further includes conductors 128, 130. The conductor 128 may include a positive lead wire and a negative lead wire for providing electrical current from one or more direct current (DC) power sources to the TEMs 102, 104. The conductor 130 is coupled to a temperature sensor (not shown) such as a thermistor positioned adjacent to the TEMs 102, 104. The temperature sensor may provide feedback signals representing a sensed temperature to a control circuit for controlling the TEMs 102, 104.

In the example of FIGS. 1-2, the gasket 110 extends between the heat exchangers 106, 108 and around the TEMs 102, 104. In such examples, the gasket 110 may form a seal around the TEMs 102, 104 thereby insulating the TEMs 102, 104 and providing at least some protection to the TEMs 102, 104 against moisture, debris, etc. For example, the gasket 110 may be formed of a material this is compressible (at least partially) between the heat exchangers 106, 108 to form an enclosure around the TEMs 102, 104. For instance, the gasket 110 may be include a porous material such as foam (e.g., closed cell polyethylene foam, etc.) or another suitable insulating material. In examples where foam is employed, the foam may be die-cut or formed in place.

The heat exchangers 106, 108 of FIGS. 1-2 are coupled to the TEMs 102, 104, and are used to help move heat from one environment to another environment. For example, heat in a first environment may be absorbed by the heat exchanger 108 (sometimes referred to as a cold side heat exchanger), pumped across the TEMs 102, 104, and dissipated into a second environment through the heat exchanger 106 (sometimes referred to as a hot side heat exchanger). In such examples, the temperature in the first environment decreases due to the removal of heat. In some examples, one or more fans may be positioned adjacent to the heat exchangers 106, 108 to push and/or pull air across, through, etc. the heat exchangers 106, 108.

The heat exchangers 106, 108 of FIGS. 1-2 may be any suitable component capable of transferring heat. In the particular example of FIGS. 1-2, the heat exchangers 106, 108 are shown as sinks. For example, and as shown in FIGS. 1-2, the heat exchanger 106 includes the base 120 and a set of fins 122 extending from the base 120, and the heat exchanger 108 includes the base 124 and a set of fins 126 extending from the base 124. The base 120 includes a top surface adjacent to the fins 122 and a bottom surface adjacent to the gasket 110, and the base 124 includes a top surface adjacent to the gasket 110 and a bottom surface adjacent to the fins 126. Each set of fins 122, 126 are separated to allow air to pass through. In such examples, the heat exchangers 106, 108 move heat through convection, and the TEA 100 functions as an air-to-air system.

In other embodiments, one or both heat exchangers 106, 108 may include another suitable type of heat transferring component. For example, the cold side heat exchanger 106 may include a cold plate or block. In such examples, the heat exchanger 106 may absorb heat through conduction.

The TEMs 102, 104 are used to help move heat from one environment to another environment. For example, when electrical current is provided to the TEMs 102, 104 via the conductor 128, each TEM 102, 104 creates a temperature differential ($\Delta T$) between its respective cold side and hot side causing the temperature of the hot side to increase and the temperature of the cold side to decrease. This temperature differential ($\Delta T$) may be controlled by adjusting the amount of current provided to each TEM 102, 104 based on, for example, feedback signals from the temperature sensor (and the conductor 130). In some examples, the temperature differential ($\Delta T$) may range up to about 72° C. at a heat pumping capacity (Qc) of zero, and the heat pumping capacity (Qc) may range up to about 69 watts when the temperature differential ($\Delta T$) is zero.

In the example of FIGS. 1-2, the TEA 100 includes two TEMs 102, 104. Although the TEA 100 is shown as including two TEMs, it should be appreciated that the TEA 100 (and/or any other TEA disclosed herein) may include another suitable number of TEMs. For example, the TEA 100 (and/or any other TEA disclosed herein) may include one TEM, two TEMs, three TEMs, etc.

Figure 3:
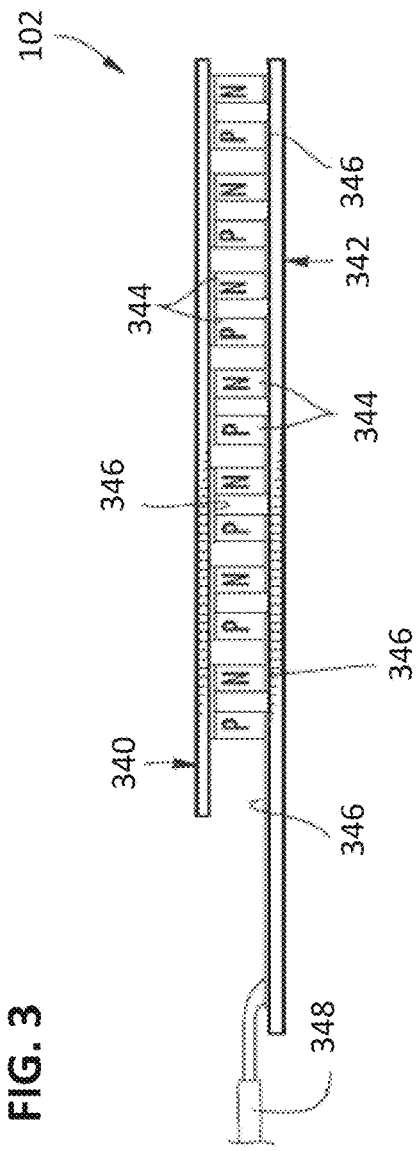
FIG. 3 is a side view of a thermoelectric module employable in a thermoelectric assembly according to another example embodiment.

The TEMs 102, 104 may be any suitable type of Peltier/ thermal control module. For example, FIG. 3 illustrates one example of a TEM employable in any one of the TEAs disclosed herein. Although the example TEM of FIG. 3 is shown and described relative to TEM 102 of FIGS. 1-2, it should be apparent that the TEM of FIG. 3 may be employed as the TEM 104 of FIGS. 1-2, or as another TEM disclosed herein. Additionally, it should be appreciated that the TEMs disclosed herein may include another suitable configuration other than the configuration shown in FIG. 3.

As shown in FIG. 3, the TEM 102 includes substrates 340, 342 oriented generally in parallel with respect to each other, alternating N-type and P-type thermoelectric elements (each indicated at reference number 344) disposed generally between the substrates 340, 342, and electrically conductive pads (e.g., bus bars) 346 electrically coupling adjacent N-type and P-type thermoelectric elements 344 together. The N-type and P-type thermoelectric elements 344 can be coupled to the electrically conductive pads 346 by suitable operations (e.g., soldering, etc.).

A positive lead wire and a negative lead wire are coupled to the substrate 342 for providing power to the TEM 102. In FIG. 3, only the positive lead wire (indicated at reference number 348) is shown. In the example of FIG. 3, the positive lead wire 348 and the negative lead wire (not shown) may be or connect to the positive lead wire and the negative lead wire of the conductor 128 of FIGS. 1-2.

In the example of FIG. 3, adjacent pairs of N-type and P-type thermoelectric elements 344 are electrically coupled together in series via the electrically conductive pads 346. In other example embodiments, TEMs may include configurations of N-type and P-type thermoelectric elements other than alternating configurations (e.g., series configurations, etc.).

The substrates 340, 342, the thermoelectric elements 344, and the electrically conductive pads 346 may be formed of any suitable material. For example, one or both substrates 340, 342 (e.g., cold side and hot side substrates, respectively) may be formed of any suitable ceramic material such as aluminum oxide ($Al_2O_3$). The thermoelectric elements 344 may be formed of any suitable semiconductor material such as bismuth telluride ($Bi_2Te_3$). The conductive pads 346 may be formed any suitable conducting metallic material such as, for example, copper, nickel, aluminum, stainless steel, combinations thereof, etc. Additionally, the substrates 340, 342 and the thermoelectric elements 344 may have any shape and size. For example, the substrates 340, 342 may be substantially rectangular in shape or another suitable shape. The elements 344 may be generally cuboid in shape or another suitable shape.

During operating, the TEM 102 is electrically connected to one or more direct current (DC) power sources (not shown) via the conductors. Electrical current passing through the TEM 102 causes heat to be pumped from one side (e.g., the substate 340) of the TEM 102 to the other side (e.g., the substrate 342) of the TEM 102. This creates a warmer side (e.g., the substrate 342) and a cooler side (e.g., the substrate 340) for the TEM 102 such that objects exposed to the cooler side may subsequently be cooled (e.g., such that heat can be transferred from the object to the cooler side to the warmer side, etc.).

The barrier films disclosed herein may include multiple segments of plastic material. For example, and as shown in FIGS. 1-2 and 5, the plastic barrier film 112, 512 includes four segments of plastic material. Alternatively, another suitable number of segments such as three segments, five segments, etc. may be employed depending on, for example, the shape of the gasket. In other examples, the barrier films disclosed herein may include a single continuous segment of plastic material.

Figure 4:
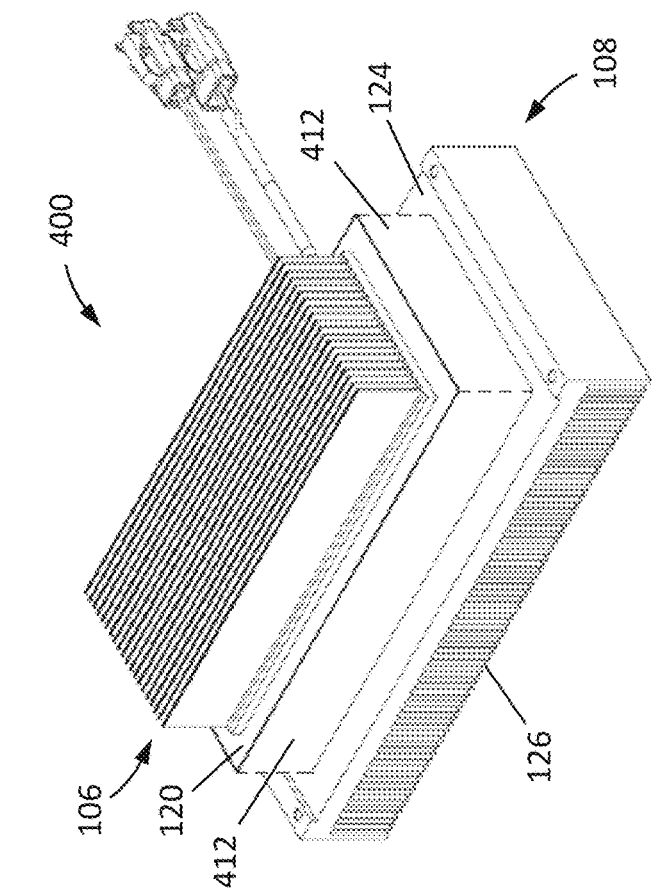
FIG. 4 is an isometric view of a thermoelectric assembly including a barrier film formed of a single continuous piece of plastic material according to another example embodiment.

For example, FIG. 4 illustrates a TEA 400 substantially similar to the TEA 100 of FIGS. 1-2 but including a barrier film formed of a single continuous segment of plastic material. Specifically, the TEA 400 of FIG. 4 includes the heat exchangers 106, 108 of FIGS. 1-2, a gasket (not shown), and a plastic barrier film 412 coupled (e.g., adhesively coupled) to the gasket. In the example of FIG. 4, the barrier film 412 is similar to the barrier film 112 of FIGS. 1-2 but is formed of a single continuous segment of the plastic material coupled to the gasket. The barrier film 412 is coupled to the gasket via an adhesive coating along its interior surface (adjacent to the gasket) or via one or more separates, intervening adhesive layers, as explained herein.

As shown in FIG. 4, the plastic barrier film 412 wraps around the gasket and portions of the heat exchangers 106. For example, the plastic barrier film 412 covers the entire outer perimeter of the gasket and a side surface of the heat exchanger 106. In some examples, the plastic barrier film 412 may be substantially flush with a top surface of the base 120 of the heat exchanger 106. As such, the plastic barrier film 412 may extend between a top surface of the base 124 of the heat exchanger 108 and the top surface of the base 120 of the heat exchanger 106, as shown in FIG. 4.

In various embodiments, edges of the plastic barrier films disclosed herein may be secured to gaskets, heat exchangers, etc. For example, an adhesive material such as a room-temperature-vulcanizing (RTV) silicone adhesive may be disposed (e.g., in the form of a bead) along one or more edges of the plastic barrier films to adhere the barrier films to the gaskets, heat exchangers, etc. In some examples, the adhesive material may be disposed along only one side of the plastic barrier films. In other examples, the adhesive material may be disposed along multiple sides of the plastic barrier films. For instance, the adhesive material may be disposed along a bottom side (e.g., a bottom edge) of one of the plastic barrier films disclosed herein adjacent to a hot side heat exchanger and/or along a top side (e.g., a top edge) of one of the plastic barrier films disclosed herein adjacent to a cold side heat exchanger.

Figure 6:
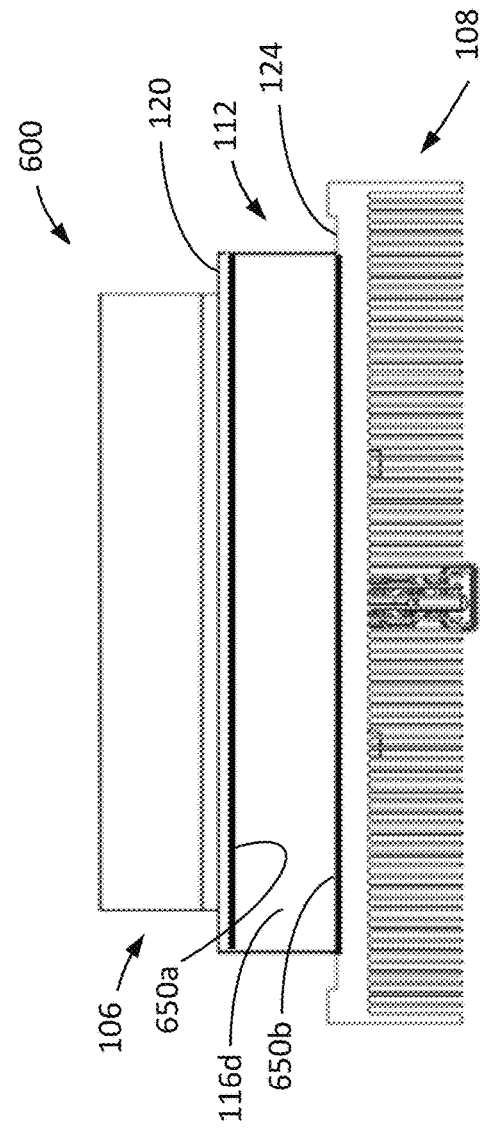
FIG. 6 is a side view of a thermoelectric assembly including a plastic barrier film and adhesive material disposed along bottom and top edge surfaces of the plastic barrier film according to one example embodiment of the present disclosure.
Figure 7:
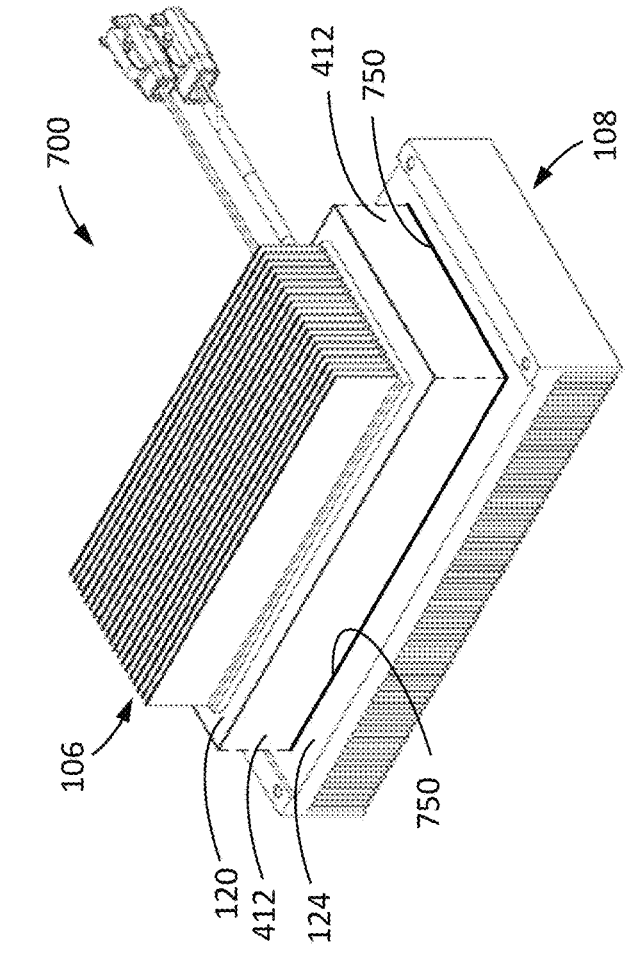
FIG. 7 is an isometric view of a thermoelectric assembly including a plastic barrier film and adhesive material disposed along bottom edge surfaces of the plastic barrier film according to one example embodiment of the present disclosure.

FIGS. 6-7 illustrate TEAs 600, 700 including adhesive material such as a RTV silicone adhesive along one or both sides of a plastic barrier film. The adhesive material may secure the barrier film to one or more other components such as gaskets, heat exchangers, etc. and provide a seal between the plastic barrier film and the other components to help inhibit an ingress of moisture. For example, the TEA 600 is substantially similar to the TEA 100 of FIGS. 1-2, but includes an adhesive material disposed along both sides of a plastic barrier film. The TEA 700 is substantially similar to the TEA 400 of FIG. 4, but includes an adhesive material disposed one side of a plastic barrier film.

The TEA 600 of FIG. 6 includes a gasket (not shown), the heat exchangers 106, 108 and the plastic barrier film 112 of FIGS. 1-2, and adhesive material 650a, 650b to adhere the barrier film 112 to the gasket and/or the heat exchangers 106, 108. As shown, the heat exchanger 106 includes the base 120, the heat exchanger 108 includes the base 124, and the barrier film 112 includes the segment 116d.

In the example of FIG. 6, the adhesive material 650a is disposed along one or more top edge surfaces of the plastic barrier film 112. Specifically, as shown in FIG. 6, the adhesive material 650a is disposed along the top edge surface of the segment 116d adjacent to the base 120 of the heat exchanger 106. In such examples, the adhesive material 650a may be used to secure the segment 116d to the gasket and/or the base 120 of the heat exchanger 106. Although not shown, it should be appreciated that the adhesive material 650a (and/or another suitable adhesive material) may be disposed along other edge surfaces of the plastic barrier film 112. For example, the adhesive material 650a may extend around the entire perimeter of the top edge surfaces of the plastic barrier film 112 adjacent to the base 120 of the heat exchanger 106.

Similarly, the adhesive material 650b is disposed along one or more bottom edge surfaces of the plastic barrier film 112. As shown in FIG. 6, the adhesive material 650b is disposed along the bottom edge surface of the segment 116d adjacent to the base 124 of the heat exchanger 108 to secure the segment 116d to the gasket and/or the base 124. Although not shown, it should be appreciated that the adhesive material 650b (and/or another suitable adhesive material) may be disposed along other edge surfaces of the plastic barrier film 112. For example, the adhesive material 650b may extend around the entire perimeter of the bottom edge surfaces of the plastic barrier film 112 adjacent to the base 124.

The TEA 700 of FIG. 7 includes a gasket (not shown), the heat exchangers 106, 108 and the plastic barrier film 412 of FIG. 4, and an adhesive material 750 to adhere the barrier film 412 to the gasket and/or the heat exchanger 108. As shown, the barrier film 412 is a single continuous segment of the plastic material that wraps around the gasket and side surfaces of the base 120 of the heat exchanger 106. In such examples, the plastic barrier film 412 may be substantially flush with a top surface of the base 120, as explained above.

The adhesive material 750 may be disposed along one or more bottom edge surfaces of the plastic barrier film 412. Specifically, in the example of FIG. 7, the adhesive material 750 is disposed along the entire bottom edge surface of the continuous barrier film 412 adjacent to the base 124 of the heat exchanger 108. In such examples, the adhesive material 750 may be used to secure the plastic barrier film 412 to the gasket and/or the base 124 of the heat exchanger 108.

In exemplary embodiments, a thermoelectric assembly includes a thermoelectric module having a hot side and a cold side, a first heat exchanger coupled to the hot side of the thermoelectric module, a second heat exchanger coupled to the cold side of the thermoelectric module, a gasket positioned between the first heat exchanger and the second heat exchanger and defining an opening for receiving the thermoelectric module, and a plastic barrier film. The gasket includes an inner perimeter adjacent to the thermoelectric module and an outer perimeter distal to the thermoelectric module. The plastic barrier film is coupled to at least a portion of the outer perimeter of the gasket to substantially inhibit an ingress of moisture to the gasket and the thermoelectric module.

In exemplary embodiments, a thermoelectric assembly includes a barrier film consisting of plastic. The plastic includes only one or more plastic materials. The barrier film does not include metal, metalized plastic, ceramic, or glass. In exemplary embodiments, the plastic includes a polyimide or other thermoplastic material.

In exemplary embodiments, the barrier film is configured to have a water vapor permeability between 1 and 20 g/m$^2$*24 hr (according to the ASTM E96 test method) and a moisture absorption rate between 0.2 and 1.5% at 23° C. and 50% RH (according to the ASTM D570 test method).

In exemplary embodiments, a thermoelectric assembly includes a dielectric plastic barrier film. The dielectric plastic barrier film plastic includes only one or more plastic materials. The dielectric plastic barrier film does not include metal, metalized plastic, ceramic, or glass. In exemplary embodiments, the dielectric plastic barrier film consists of plastic or consists essentially of plastic. In exemplary embodiments, the dielectric plastic barrier film consists essentially of a polyimide or other thermoplastic material.

In exemplary embodiments, the dielectric plastic barrier film is configured to have a water vapor permeability between 1 and 20 g/m$^2$*24 hr (according to the ASTM E96 test method) and a moisture absorption rate between 0.2 and 1.5% at 23° C. and 50% RH (according to the ASTM D570 test method).

In exemplary embodiments, a thermoelectric assembly includes a barrier film consisting essentially of plastic. The plastic includes only one or more plastic materials. The barrier film does not include metal, metalized plastic, ceramic, or glass. In exemplary embodiments, the plastic is a polyimide or other thermoplastic material.

In exemplary embodiments, the barrier film is configured to have a water vapor permeability between 1 and 20 g/m$^2$*24 hr (according to the ASTM E96 test method) and a moisture absorption rate between 0.2 and 1.5% at 23° C. and 50% RH (according to the ASTM D570 test method).

In exemplary embodiments, the barrier film is coupled to the entire outer perimeter of the gasket. The barrier film includes a single continuous segment of the plastic coupled to the entire outer perimeter of the gasket. In other exemplary embodiments, the gasket includes a plurality of surfaces defining the outer perimeter. The barrier film includes a plurality of segments each consisting of the plastic. Each segment of the barrier film is coupled to a different one of the plurality of surfaces of the gasket.

In exemplary embodiments, the barrier film is adhesively coupled to the portion of the outer perimeter of the gasket.

In exemplary embodiments, the barrier film includes a plurality of edge surfaces, and wherein the thermoelectric assembly further comprises an adhesive material disposed along at least one of the edge surfaces of the barrier film to adhere the barrier film to the gasket.

In exemplary embodiments, the first heat exchanger includes a sink and/or the second heat exchanger includes a sink.

In exemplary embodiments, the gasket includes foam.

In exemplary embodiments, the first heat exchanger includes a base and the second heat exchanger includes a base having an edge. The barrier film is coupled to the outer perimeter of the gasket and extends between the base of the first heat exchanger and the edge of the base of the second heat exchanger.

In exemplary embodiments, the thermoelectric module comprises first and second thermoelectric modules each including a hot side and a cold side. The first heat exchanger is coupled to the hot sides of the first and second thermoelectric modules. The second heat exchanger is coupled to the cold sides of the first and second thermoelectric modules. The gasket defines the opening for receiving the first and second thermoelectric modules. The barrier film is coupled to at least a portion of the outer perimeter of the gasket to substantially inhibit the ingress of moisture to the gasket and the first and second thermoelectric modules.

By employing any one of the TEAs disclosed herein including a plastic barrier film, moisture ingress into gaskets (e.g., foam gaskets) may be minimized. This provides enhanced protection for the TEA against high humidity and/or high temperature environments which may create moisture that would otherwise reduce the performance of TEMS and/or other components in the TEA, cause corrosion within the TEMs, etc.

As explained herein, the barrier films disclosed herein include only one or more plastic materials such as thermoplastic material. The barrier films do not include metal, metalized plastic, ceramic, or glass. Because the barrier films are formed of only plastic materials, the plastic barrier films are less likely to become damaged due to chemical reactions such as oxidization as compared to films including metallic materials. Additionally, the plastic barrier films disclosed herein have a longer life span than films including metallic materials, ceramic materials, and/or glass materials. Further, the plastic barrier films disclosed herein have a thermal conductivity lower than that of films including metallic materials, ceramic materials, and/or glass materials. For example, the plastic barrier films disclosed herein may have a thermal conductivity between 0.10 and 0.35 W/mK. The thermal conductivity of the plastic barrier films may be 5-10 times lower than that of glass films, 7-700 times lower than that of films with metallic materials, and 50-1,500 times lower than that of ceramic films. As such, employing plastic barrier films between heat exchangers in a TEA reduces the potential for thermal transfer between the hot and cold sides of the TEA as compared to films including metallic materials, ceramic materials, and/or glass materials.

Additionally, the TEAs disclosed herein may be employed in various applications. For example, any one or more of the TEAs disclosed herein may be employed to control temperatures in a variety of applications, such as laser diode packages in active optics, lasers in medical and industrial instrumentation, enclosures (e.g., electronic enclosures, reagent cabinets, etc.), sample storage chambers in medical diagnostics and analytical instruments, and batteries in various automotive and telecom applications.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Whether or not modified by the term "about", equivalents to the quantities are included.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer, or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use "or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermoelectric assembly comprising:
   a thermoelectric module including a hot side and a cold side;
   a first heat exchanger coupled to the hot side of the thermoelectric module;
   a second heat exchanger coupled to the cold side of the thermoelectric module;
   a gasket positioned between the first heat exchanger and the second heat exchanger and defining an opening for receiving the thermoelectric module, the gasket including an inner perimeter adjacent to the thermoelectric module and an outer perimeter distal to the thermoelectric module; and
   a dielectric plastic barrier film, the dielectric plastic barrier film adhesively coupled to at least a portion of the outer perimeter of the gasket to substantially inhibit an ingress of moisture to the gasket and the thermoelectric module, wherein the dielectric plastic barrier film includes a thermoplastic material with a plastic material coated thereon.

2. The thermoelectric assembly of claim 1, wherein the dielectric plastic barrier film consists essentially of plastic.

3. The thermoelectric assembly of claim 1, wherein the dielectric plastic barrier film consists only of plastic.

4. The thermoelectric assembly of claim 1, wherein the dielectric plastic barrier film plastic includes only one or more plastic materials.

5. The thermoelectric assembly of claim 1, wherein the dielectric plastic barrier film consists essentially of a polyimide.

6. The thermoelectric assembly of claim 1, wherein the dielectric plastic barrier film consists of only one or more plastic materials such that the dielectric plastic barrier film does not include metal, metalized plastic, ceramic, or glass.

7. The thermoelectric assembly of claim 1, wherein the dielectric plastic barrier film is adhesively coupled to the entire outer perimeter of the gasket.

8. The thermoelectric assembly of claim 7, wherein the dielectric plastic barrier film includes a single continuous segment adhesively coupled to the entire outer perimeter of the gasket.

9. The thermoelectric assembly of claim 7, wherein the gasket includes a plurality of surfaces defining the outer perimeter, wherein the dielectric plastic barrier film includes a plurality of segments each coupled to a different one of the plurality of surfaces of the gasket.

10. The thermoelectric assembly of claim 1, wherein the dielectric plastic barrier film is adhesively coupled, via a room-temperature-vulcanizing (RTV) silicone adhesive, to the entire outer perimeter of the gasket, and wherein:
    the dielectric plastic barrier film consists of only one or more plastic materials such that the dielectric plastic barrier film does not include metal, metalized plastic, ceramic, or glass;
    the dielectric plastic barrier film is configured to have a water vapor permeability between 1 and 20 $g/m^2*24$ hr (according to the ASTM E96 test method); and
    the dielectric plastic barrier film is configured to have a moisture absorption rate between 0.2 and 1.5% at 23° C. and 50% RH (according to the ASTM D570 test method).

11. The thermoelectric assembly of claim 1, wherein:
    the dielectric plastic barrier film includes a plurality of edge surfaces; and
    the thermoelectric assembly further comprises an adhesive material disposed along at least one of the plurality of the edge surfaces of the dielectric plastic barrier film to adhere the dielectric plastic barrier film to the gasket.

12. The thermoelectric assembly of claim 1, wherein the first heat exchanger includes a cold sink and/or the second heat exchanger includes a hot sink.

13. The thermoelectric assembly of claim 1, wherein the gasket includes foam.

14. The thermoelectric assembly of claim 1, wherein:
    the first heat exchanger includes a base;
    the second heat exchanger includes a base having an edge; and
    the dielectric plastic barrier film is adhesively coupled to the outer perimeter of the gasket and extends between the base of the first heat exchanger and the edge of the base of the second heat exchanger.

15. The thermoelectric assembly of claim 1, wherein:
    the dielectric plastic barrier film is configured to have a water vapor permeability between 1 and 20 $g/m^2*24$ hr (according to the ASTM E96 test method); and/or
    the dielectric plastic barrier film is configured to have a moisture absorption rate between 0.2 and 1.5% at 23° C. and 50% RH (according to the ASTM D570 test method).

16. The thermoelectric assembly of claim 1, wherein:
    the thermoelectric module comprises first and second thermoelectric modules each including a hot side and a cold side;
    the first heat exchanger is coupled to the hot sides of the first and the second thermoelectric modules;
    the second heat exchanger is coupled to the cold sides of the first and the second thermoelectric modules;
    the gasket defines the opening for receiving the first and the second thermoelectric modules; and
    the dielectric plastic barrier film is adhesively coupled to at least a portion of the outer perimeter of the gasket to substantially inhibit the ingress of moisture to the gasket and the first and the second thermoelectric modules.

17. A thermoelectric assembly comprising:
    a thermoelectric module including a hot side and a cold side;
    a first heat exchanger coupled to the hot side of the thermoelectric module;
    a second heat exchanger coupled to the cold side of the thermoelectric module;

a gasket positioned between the first heat exchanger and the second heat exchanger and defining an opening for receiving the thermoelectric module, the gasket including an inner perimeter adjacent to the thermoelectric module and an outer perimeter distal to the thermoelectric module; and a dielectric barrier film consisting of plastic, the dielectric barrier film adhesively coupled to at least a portion of the outer perimeter of the gasket to substantially inhibit an ingress of moisture to the gasket and the thermoelectric module, wherein the dielectric barrier film includes a thermoplastic material with a plastic material coated thereon.

18. The thermoelectric assembly of claim 17, wherein:

the dielectric barrier film consists of only one or more plastic materials such that the barrier film does not include metal, metalized plastic, ceramic, or glass;

the thermoelectric module comprises first and second thermoelectric modules each including the hot side and the cold side;

the first heat exchanger is coupled to the hot sides of the first and the second thermoelectric modules;

the second heat exchanger is coupled to the cold sides of the first and the second thermoelectric modules;

the gasket defines the opening for receiving the first and the second thermoelectric modules; and the dielectric barrier film is adhesively coupled to at least a portion of the outer perimeter of the gasket to substantially inhibit the ingress of moisture to the gasket and the first and the second thermoelectric modules.

19. A thermoelectric assembly comprising:

a thermoelectric module including a hot side and a cold side;

a first heat exchanger coupled to the hot side of the thermoelectric module;

a second heat exchanger coupled to the cold side of the thermoelectric module;

a gasket positioned between the first heat exchanger and the second heat exchanger and defining an opening for receiving the thermoelectric module, the gasket including an inner perimeter adjacent to the thermoelectric module and an outer perimeter distal to the thermoelectric module; and a dielectric barrier film consisting essentially of plastic, the dielectric barrier film adhesively coupled to at least a portion of the outer perimeter of the gasket to substantially inhibit an ingress of moisture to the gasket and the thermoelectric module, wherein the dielectric barrier film includes a thermoplastic material with a plastic material coated thereon.

20. The thermoelectric assembly of claim 19, wherein:

the dielectric barrier film consists of only one or more plastic materials such that the barrier film does not include metal, metalized plastic, ceramic, or glass;

the thermoelectric module comprises the first and the second thermoelectric modules each including a hot side and a cold side;

the first heat exchanger is coupled to the hot sides of the first and the second thermoelectric modules;

the second heat exchanger is coupled to the cold sides of the first and the second thermoelectric modules;

the gasket defines the opening for receiving the first and the second thermoelectric modules; and the dielectric barrier film is adhesively coupled to at least a portion of the outer perimeter of the gasket to substantially inhibit the ingress of moisture to the gasket and the first and the second thermoelectric modules.

* * * * *